United States Patent [19]

Kusters et al.

[11] Patent Number: 4,628,257
[45] Date of Patent: Dec. 9, 1986

[54] WATTMETER

[75] Inventors: Norbert L. Kusters; Glen A. Herriot, both of Ottawa, Canada

[73] Assignee: Canadian Patents and Development Limited, Ottawa, Canada

[21] Appl. No.: 674,975

[22] Filed: Nov. 26, 1984

[51] Int. Cl.[4] ............... G01R 17/02; G01R 15/10; G01R 5/22
[52] U.S. Cl. .............................. 324/142; 324/98; 324/106; 324/132
[58] Field of Search .............. 324/142, 106, 98, 132

[56] References Cited

U.S. PATENT DOCUMENTS 3,842,349 10/1974 Cox et al. ................................ 324/98
4,045,734 8/1977 Cox et al. .............................. 324/142

OTHER PUBLICATIONS

IEEE Trans. on Instrum. & Meas., Cox, L. et al., "A Differential Thermal Wattmeter ... ", vol. IM-25, No. 4, Dec. 1976, pp. 553-557.
IEEE Trans. on Instrum. & Meas., Kusters, N. et al., "The Development of an Automatic-Reversing Differential Thermal Wattmeter", vol. IM-29, No. 4, Dec. 1980, pp. 426-431.
Conference: CPEM Dig. 1980, Conf. on Precision Electromagnetic Measurements, Braunschweig, Germany, Filipski, P., "New Approach to Reactive Current and Effective Reactive Power Measurement in Nonsinusoidal Systems", Jun. 1980, pp. 380-382.

Primary Examiner—Reinhard J. Eisenzopf
Assistant Examiner—Stephen M. Baker

[57] ABSTRACT

A differential thermal wattmeter of the type disclosed in U.S. Pat. No. 4,045,734 is modified to remove undesirable in-phase a.c. ripple at the fundamental frequency in the feedback path. This result is achieved by a closed loop system in which the in-phase signal in the feedback path is detected and driven to zero by injecting sufficient signal in opposite polarity into the feedback path to cancel the ripple. The advantages are reduction of error and the ability to use standard, low cost components.

4 Claims, 13 Drawing Figures

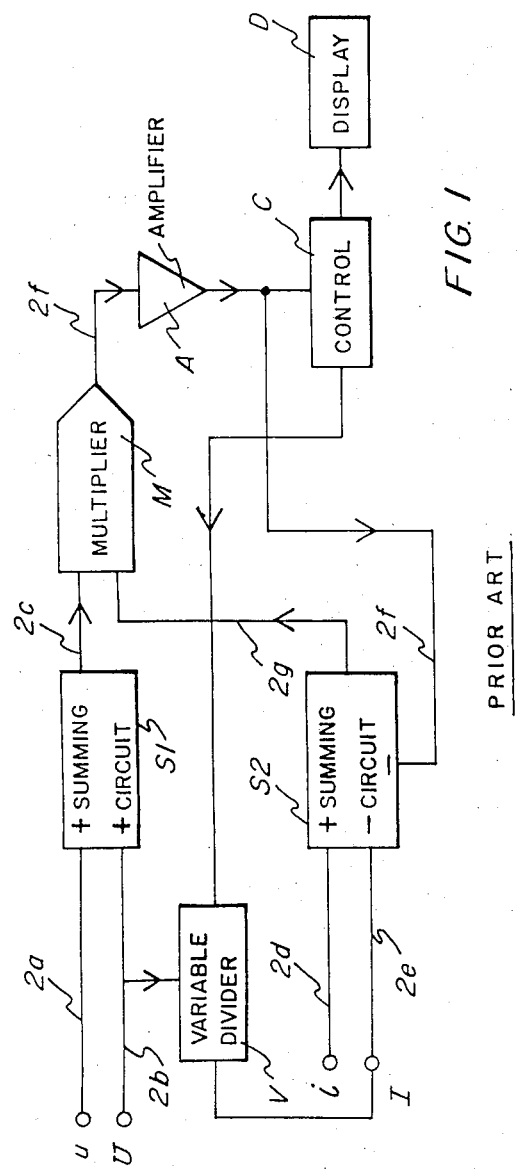

WATTMETER

BACKGROUND OF THE INVENTION

This invention relates to improvement in precision wattmeters and is particularly suitable for use with thermal wattmeters More specifically, the invention has been developed for use with a differential thermal wattmeter of the type disclosed in U.S. Pat. No. 4,045,734 issued Aug. 30, 1977 to L. G. Cox and N. L. Kusters, and will be exemplified below in connection with this type of wattmeter. Other similar circuits are decribed in greater detail, both as to structure and function, in "A Differential Thermal Wattmeter for the ac/dc Transfer of Power" by L. G. Cox and N. L. Kusters pp. 553–557, Vol. 1M-25, No. 4, December 1976, IEEE Transactions on Instrumentation and Measurement; and "The Development of an Automatic-Reversing Differential Thermal Wattmeter" by N. L. Kusters and L. G. Cox pp. 426–431, Vol. 1M-29, No. 4, December 1980, IEEE Transactions on Instrumentation and Measurement.

To enable the prior art to be explained with the aid of diagrams, the figures of the accompanying drawings will first be listed.

BRIEF DESCRIPTION OF THE DRAWINGS

FIG. 1 is a diagram showing a prior art circuit as disclosed in the above-mentioned prior patent;

PRIOR ART

Figure 2A:
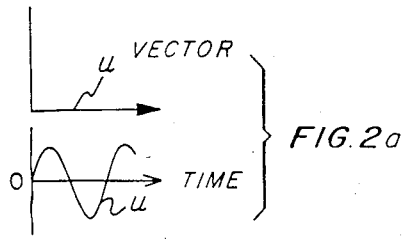
FIGS. 2a to 2g is a series of vector and waveform diagrams illustrating the performance of the circuit of FIG. 1.
Figure 2B:
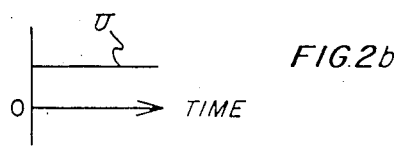
Figure 2C:
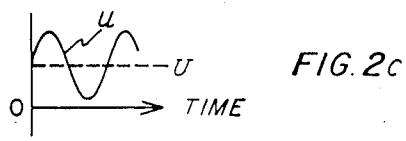
Figure 2D:
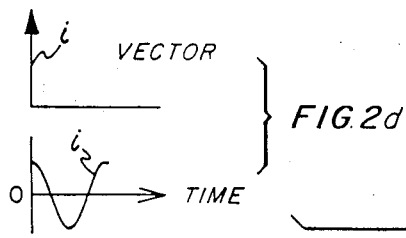
Figure 2E:
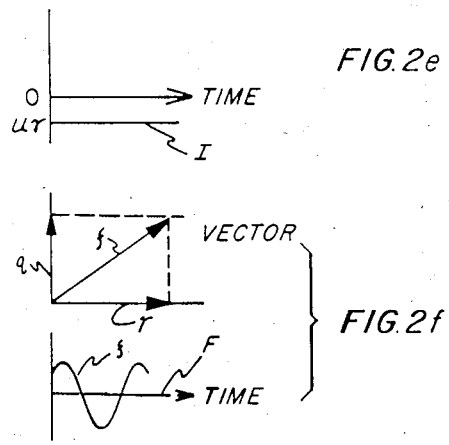
Figure 2F:
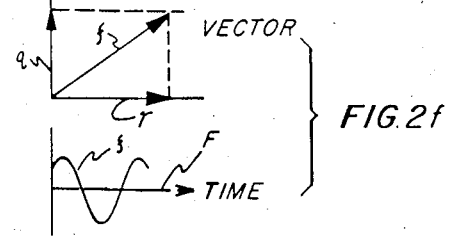
Figure 2G:
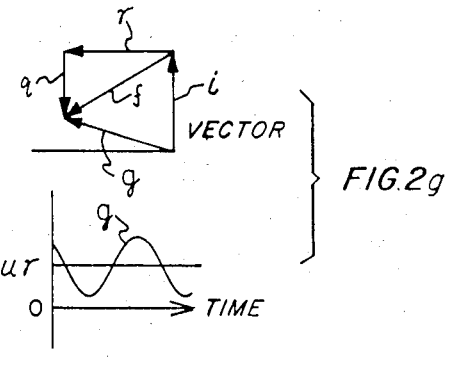
Figure 3:
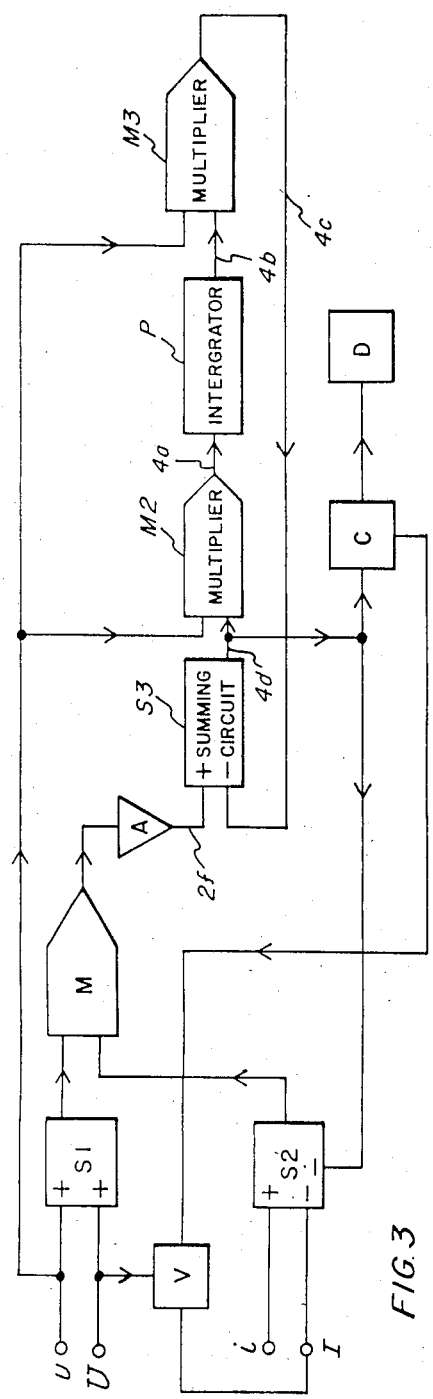
FIG. 3 is a circuit diagram of an embodiment of the present invention.

FIG. 1 shows essentially the same circuit as in FIG. 3 of said prior patent. While designed to achieve high precision measurement, e.g., an error down to about 30 ppm, this circuit has difficulty achieving such precision under all conditions. Probably the worst condition in this respect is at or near zero power factor. To illustrate this problem, the diagrams of FIG. 2 show the nature of the various signals at zero power factor.

Using lower case letters for a.c. signals and capital letters for d.c. signals, the signals u and i are respectively proportional to and represent the amplitude and phase of the input a.c. voltage and current, the wattage of which is to be determined. U is a reference d.c. voltage signal obtained from a standard source (not shown) and I is a d.c. current signal that is adjustable relative to the signal U by a variable divider V under the control of a control device C.

The voltage signals u and U applied on lines 2a and 2b are shown in FIGS. 2a and 2b respectively. They enter a summing circuit S1 which generates on line 2c a first output shown in FIG. 2c.

The current signal i (FIG. 2d) is applied on line 2d to a second summing circuit S2 which also receives the current signal I on line 2e (FIG. 2e). Since $IU=iu \cos \theta$, at zero power factor with $\cos \theta=0$, I should theoretically equal zero, but in fact there is an error and it equals -ur as explained below. The second summing circuit S2 also receives a feedback signal-(F+f) from line 2f (FIG. 2f), as more fully explained below.

The first and second outputs 2c and 2g (FIG. 2g) of the respective summing circuits S1 and S2 form the inputs to a wattmeter multiplier M. It is not deemed necessary to describe this multiplier in detail. For example, it may take the form of the thermal multiplier illustrated in the above patent, constituting, in effect, all of the circuit of FIG. 3 of such prior patent to the right of the operational amplifiers 33 and 36 (including the resistors 37, 38, 40, 41) for obtaining the sum and difference of the a.c. and d.c. signals for the purpose fully explained in such prior patent.

The output g of the summing circuit S2 appearing on line 2g and shown in FIG. 2g, consists of $i-I-(F+f)$. Signal f can be broken down into $r+q$, where r is the component in phase with the voltage signal u, and q is the quadrature component. Hence, the signal g is $i-I-(F+r+q)$. At zero power factor, ideally $I=F=0$ and hence $g=i-r-q$, as shown in FIG. 2g. This signal g is combined in the multiplier M with the signal $U+u$ from line 2c. The output of the multiplier M on line 2f (referred to as the "third output") is the signal $(U+u)-(i-r-q)$ which is returned via an amplifier A to the feedback line 2f. The unknown a.c. power is directly read on a display D (preferably digital) responsive to the condition of the control device C, the device C making the adjustment to I in the variable divider V required to bring the D.C. component F of the signal on line 2f to zero, as determined by a null indicator incorporated in the control device C. The foregoing is all prior art.

The problem is that, in practice, this signal is contaminated by a fundamental frequency a.c. ripple component r in-phase with the voltage signal u, that appears in the feedback line 2f and reacts with the unknown inputs to produce an error, i.e. the apparent real power ur.

Solutions to this problem that have been proposed include increasing the thermal mass of the thermal converter in the multiplier or inserting a low pass filter in the feedback path. Other methods include trying to simulate the expected ripple and subtracting it from the feedback.

None of these proposals has, however, been found satisfactory or convenient in practice. Thermal or electrical filtering is a compromise between the amount of ripple attenuation available and the response time and loop stability. In other words, speed must be sacrificed for stability and accuracy. Simulating the ripple with an electronic circuit or even with another thermal converter has proved impracticable, because of the variation among thermal converters.

SUMMARY OF THE INVENTION

The principal objective of the present invention is to solve this ripple problem in a manner that achieves at least one, and preferably both, of the advantages of (a) reducing the error in the output reading, and (b) enabling the circuit to operate with a simpler and thus cheaper multiplier.

To this end, the invention provides an improvement that substantially eliminates from the feedback line the undesirable in-phase ripple component.

More specifically, it multiplies the third output in the feedback line with the voltage signal u to generate a further, "fourth" output. This output is then integrated to obtain a d.c. signal proportional to the undesirable in-phase component, while eliminating any trace of the d.c. and quadrature components. This d.c. signal is then again multiplied by the voltage signal u to generate a correction signal that is equal to and in-phase with the undesirable component. Finally, this correction signal is injected with opposite polarity into the feedback line to substantially eliminate the undesirable component therefrom.

DESCRIPTION OF THE PREFERRED EMBODIMENT

FIG. 3 demonstrates how the circuit of FIG. 1 can be modified in accordance with the present invention, like parts being identified as before. The output of the amplifier A (line 2f) passes through a third summing circuit S3, in which the desired correcting signal will be subtracted. Assuming initially and for the sake of explanation that this amplifier output signal, F+q+r, passes unchanged through the summing circuit S3, it will reach a second multiplier M2 where it is multiplied by a second input, which is the signal u on line 2a, to provide a signal u(F+q+r) on line 4a (referred to as the "fourth output").

Figure 4A:
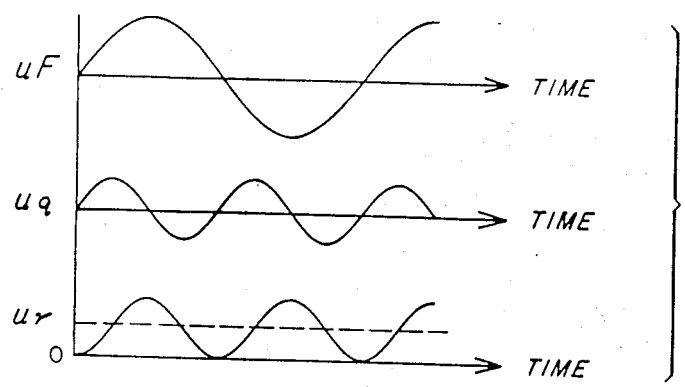
FIGS. 4a to 4d is a series of vector and waveform diagrams explaining the operation of the circuit of FIG. 3.
Figure 4B:
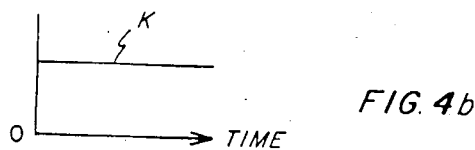

The nature of this signal is demonstrated in FIG. 4a which divides the expression u(F+q+r) into its three components uF, uq and ur. Components uF and uq are both sine waves and hence, when integrated over time in an integrator P, are equal to zero, but component ur has the form of a sine squared wave, since the signal r is in phase with the signal u. The time integral of the component ur is hence not zero, but has the value shown by the dotted line. Hence, the output of the integrator P (referred to as the "fifth output") on line 4b (FIG. 4b) is a constant d.c. signal K that represents a measure of the amplitude of the signal r which is undesirable in the line 4d. Integrator P performs the integration $$\frac{1}{T} \int_0^T u(F + q + r) = K$$

Figure 4C:
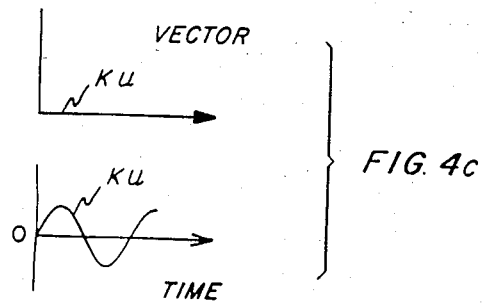
Figure 4D:
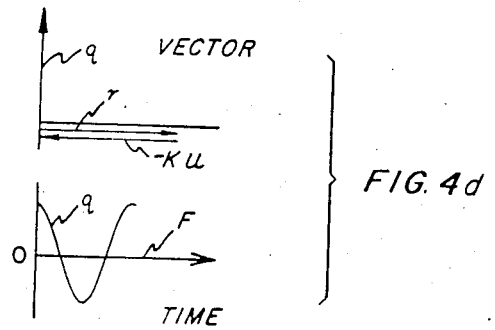

This value K is then multiplied by the signal u in a third multiplier M3 to generate an output Ku on line 4c that is shown in FIG. 4c. This output Ku is adjusted in amplitude to become a correction signal equal to the signal r, and is injected into the feedback line by being returned to the summing circuit S3 as a subtraction. Thus, in reality and contrary to the assumption made above, the signal (FIG. 4d) on the output line 4d from the summing circuit S3 becomes (F+q), with the undesirable component r effectively eliminated. As will be seen, it is this "uncontaminated" signal that now forms the true feedback to the summing circuit S2.

The additional components of FIG. 3 can thus be thought of as representing a closed loop system in which a second multiplier (M2) effectively acts as a phase sensitive detector to continuously detect the in-phase fundamental frequency in the feedback path, while a integrator (P) acts as a servo to drive this in-phase component to zero by controlling an automatic gain stage (multiplier M3) to inject sufficient fundamental frequency (in-phase but of opposite polarity) into the feedback path to cancel the in phase ripple.

The foregoing explanation of the function of the circuit has been based on the zero power factor condition, but will be found to hold for other conditions, although some of the parts of FIG. 2 would require appropriate modification. Another difficult condition (perhaps the second worst case, after the zero power factor condition) is at unity power factor, when i is full scale and u is half scale. It is not believed necessary to discuss in detail all possible situations, since a full explanation has been given for the worse case (zero power factor).

It has been found that this process can reduce the a.c./d.c. transfer error in a feedback wattmeter by a factor of at least a hundred, while permitting use of standard low cost components.

An important feature of simplicity resides in the fact that the circuit does not attempt to remove all fundamental and higher frequencies by filtering. It simply removes the only component of the feedback signal that is actually troublesome, leaving all the other components. The bandwidth of the system is thus high and hence the settling time of the instrument is short. Because the system uses a closed loop, it is self-adjusting and able to handle a wide range of frequencies and power factors at the inputs.

As explained at the outset, the invention has been specially developed for use with the thermal wattmeter disclosed in the mentioned prior patent. It is important to note, however, that the invention is not limited to use with this specific form of wattmeter and could be incorporated in other wattmeters, i.e. those using multipliers other than differential thermal converters, such as time division, quarter square or Gilbert cell multipliers.

We claim:

1. In a wattmeter for determining power corresponding to a.c. voltage and current components from respective proportional representative a.c. signals u and i, comprising
   (a) first source means for providing a d.c. voltage reference signal U,
   (b) second source means for providing a d.c. current signal I,
   (c) first summing means for adding together signals u and U to generate a first output,
   (d) second summing means for adding together signals i and I to generate a second output,
   (e) means for multiplying together said first and second outputs to generate a third output,
   (f) a feedback line supplying said third output to the second summing means,
   (g) control means acting on said second source means for adjusting the signal I to tend to bring said third output to zero, and
   (h) display means responsive to the condition of the control means for providing an indication of the power to be determined, comprising improvement of means for substantially eliminating from said feedback line an undesirable fundamental frequency a.c. ripple component that is in-phase with the signal u, said eliminating means comprising
   (i) means for multiplying said third output with the signal u to generate a fourth output,
   (j) means for integrating said fourth output to obtain a fifth output in the form of a d.c. signal proportional to said undesirable component,
   (k) means for multiplying said fifth output with the signal u to generate a correction signal equal to and in-phase with said undesirable component, and
   (l) means for injecting said correction signal with opposite polarity into the feedback line to substantially eliminate said component therefrom.

2. The wattmeter of claim 1, wherein said injecting means (l) includes third summing means connected to receive said third output and said correction signal as inputs, and to deliver an output to said means (i) for generating the fourth output.

3. The wattmeter of claim 1, wherein said means (e) for generating the third output incorporates a thermal converter.

4. The wattmeter of claim 1, wherein said means (e) for generating the third output incorporates a differential thermal converter.

* * * * *